(12) United States Patent
Johnston

(10) Patent No.: US 7,635,647 B2
(45) Date of Patent: *Dec. 22, 2009

(54) ATMOSPHERIC PRESSURE CHEMICAL VAPOR DEPOSITION

(75) Inventor: Norman W. Johnston, Perrysburg, OH (US)

(73) Assignee: Calyxo GmbH, Bitterfeld-Wolfen (DE)

( * ) Notice: Subject to any disclaimer, the term of this patent is extended or adjusted under 35 U.S.C. 154(b) by 521 days.

This patent is subject to a terminal disclaimer.

(21) Appl. No.: 11/573,768

(22) PCT Filed: Aug. 2, 2005

(86) PCT No.: PCT/US2005/027368

§ 371 (c)(1),
(2), (4) Date: Feb. 15, 2007

(87) PCT Pub. No.: WO2006/023262

PCT Pub. Date: Mar. 2, 2006

(65) Prior Publication Data

US 2008/0311729 A1     Dec. 18, 2008

Related U.S. Application Data

(60) Provisional application No. 60/602,405, filed on Aug. 18, 2004.

(51) Int. Cl.
*H01L 21/44* (2006.01)
*H05D 5/12* (2006.01)

(52) U.S. Cl. .............. 438/680; 438/681; 257/E21.101; 427/76; 427/255.31

(58) Field of Classification Search ............. 438/680, 438/681, 95, 584; 257/53, E21.101; 136/260, 136/264, 218; 427/76, 255.11, 255.31, 255.33
See application file for complete search history.

(56) References Cited

U.S. PATENT DOCUMENTS

| | | | |
|---|---|---|---|
| 4,504,526 A | | 3/1985 | Hofer et al. |
| 5,501,744 A | * | 3/1996 | Albright et al. ............. 136/258 |
| 5,536,333 A | * | 7/1996 | Foote et al. .................. 136/260 |
| 5,994,642 A | | 11/1999 | Higuchi et al. |
| 2001/0041463 A1 | * | 11/2001 | Kakkad ...................... 438/788 |
| 2006/0236939 A1 | | 10/2006 | Powell et al. |
| 2006/0236940 A1 | | 10/2006 | Powell et al. |

OTHER PUBLICATIONS

Chemical Vapor Deposition of Chalcogenide Semiconductors, NTiS, Aug. 1975, U.S. Department of Commerce, National Technical Information Service, ADA017524, Massachusetts Inst of Tech Cambridge Center for Materials Science and Engineering; H. Kent Bowen, et al.

* cited by examiner

*Primary Examiner*—Davienne Monbleau
*Assistant Examiner*—Shweta Mulcare
(74) *Attorney, Agent, or Firm*—Fraser Clemens Martin & Miller LLC; Donald R. Fraser

(57) ABSTRACT

A process for coating a substrate at atmospheric pressure comprises the steps of vaporizing a controlled mass of semiconductor material at substantially atmospheric pressure within a heated inert gas stream, to create a fluid mixture having a temperature above the condensation temperature of the semiconductor material, directing the fluid mixture at substantially atmospheric pressure onto the substrate having a temperature below the condensation temperature of the semiconductor material, and depositing a layer of the semiconductor material onto a surface of the substrate.

14 Claims, 3 Drawing Sheets

ATMOSPHERIC PRESSURE CHEMICAL VAPOR DEPOSITION

CROSS-REFERENCE TO RELATED APPLICATION

This application claims the benefit of provisional patent application Ser. No. 60/602,405, filed Aug. 18, 2004.

FIELD OF THE INVENTION

The present invention relates generally to the deposition of a vaporized chemical material on a substrate, and more particularly to a process for depositing a vaporized chemical material on a substrate at atmospheric pressure.

BACKGROUND OF THE INVENTION

Chemical vapor deposition processes such as pyrolytic processes and hydrolytic processes are well known in art of coating substrates. The physical characteristics of the coating reactants utilized in such processes may be liquid, vapor, liquids or solids dispersed in gaseous mixtures, aerosols, or vaporized or vaporous coating reactants dispersed in gaseous mixtures.

In the process of deposition of a vaporized chemical compound on a glass substrate in the production of photovoltaic devices, the vaporized chemical compound is typically deposited in a vacuum atmosphere. The systems for carrying out such process have typically included a housing having an enclosed deposition chamber formed of a lower portion and an upper portion with a horizontal junction with each other. A seal assembly is interposed at the junction between the lower and upper housings. A conveyor means is provided to transport glass sheet substrates through the chamber. A chemical vapor distributor is located within the deposition chamber to provide a coating on the glass substrate as the substrate passes through the chamber.

The system includes a vacuum source for drawing a vacuum within the deposition chamber. The deposition chamber typically includes elongate heaters for heating the glass sheets as they are conveyed through the system. The glass sheets pass into the deposition chamber from a vacuum-heating furnace to the vacuum deposition chamber that is maintained at a similar vacuum and temperature setting as the heating furnace. Powdered cadmium sulfide and powdered cadmium telluride are fed into the vaporization deposition chamber. The films are then deposited onto the previously coated and heated glass substrates sequentially. The coated substrates are next transferred through a load lock and thence into a cooling chamber wherein cooling is effected by compressed nitrogen and finally conveyed to atmosphere pressure though an exit load lock to an air cooling section for reduction to ambient temperature. The cadmium telluride thin-film material requires a follow-on processing step to re-crystallize its polycrystalline structure so that effective photovoltaic devices can be made from the film stack. Typically this step is accomplished by applying a solution of cadmium chloride to the cadmium telluride surface of the cooled coated glass and re-heating the glass to a temperature of about 390° C. to 420° C. for a period of about 15 to 20 minutes. Care must be taken to slowly heat and cool the glass to avoid breakage during this treatment which extends the overall process time of the required step.

Since it is well recognized that renewable energy sources are becoming increasingly more important, it is deemed that commercial production of photovoltaic devices for the generation of electrical energy is important in satisfying the renewable energy needs. The utilization of thin-film coatings of semiconductor materials on glass substrates is considered to be a viable mechanism in the field of photovoltaic-based electrical energy generation systems.

It has been found that thin-film coating systems, based upon the above referred to technology, are capable of depositing thin film of cadmium sulfide/cadmium telluride photovoltaic material onto commercially available soda-lime glass substrates in a vacuum. The photovoltaic materials are subsequently treated to re-crystallize the cadmium telluride surface making the film stack ready for further processing into photovoltaic devices. While the above-described system is capable of producing photovoltaic panels suitable for the production of electrical energy, it would be desirable to reduce the cost for such production to render the system commercially viable.

SUMMARY OF THE INVENTION

It is an object of the present invention to produce a photovoltaic panel by depositing thin-films of semiconductor materials from chemical vapors on a substrate at atmospheric pressure.

Another object of the present invention is to produce a photovoltaic panel by vaporizing cadmium sulfide and cadmium telluride and depositing the same on the surface of a heated substrate to form a first thin film of cadmium sulfide and a second thin film of cadmium telluride at atmospheric pressure.

Another object of the present invention is to produce a photovoltaic panel by rapid high temperature re-crystallization of the thin-film cadmium telluride polycrystalline material to yield high efficiency photovoltaic devices.

It has surprisingly been found that the above objects may be achieved by a process for coating a substrate at atmospheric pressure, comprising the steps of: (1) providing sources of semiconductor materials such as cadmium sulfide or cadmium telluride; (2) heating and vaporizing the semiconductor materials at substantially atmospheric pressure, and maintaining the vaporized materials at temperatures above their temperatures of condensation; and (3) sequentially depositing the vaporized materials on a heated surface of a substrate such as glass at substantially atmospheric pressure, to form a laminar structure. Optionally, while the laminar structure is still substantially at the temperature of deposition and at substantially atmospheric pressure, a cadmium telluride layer may be treated with a reactive gas to effect a re-crystallization of the cadmium telluride. Subsequent processing of the laminar film stack may be accomplished to produce active thin-film photovoltaic devices.

BRIEF DESCRIPTION OF THE DRAWINGS

The above as well as other objects and advantages of the invention will become readily apparent to those skilled in the art from reading the following detailed description of a preferred embodiment of the invention in the light of the accompanying drawings, in which.

DETAILED DESCRIPTION OF THE PREFERRED EMBODIMENT

Figure 1:
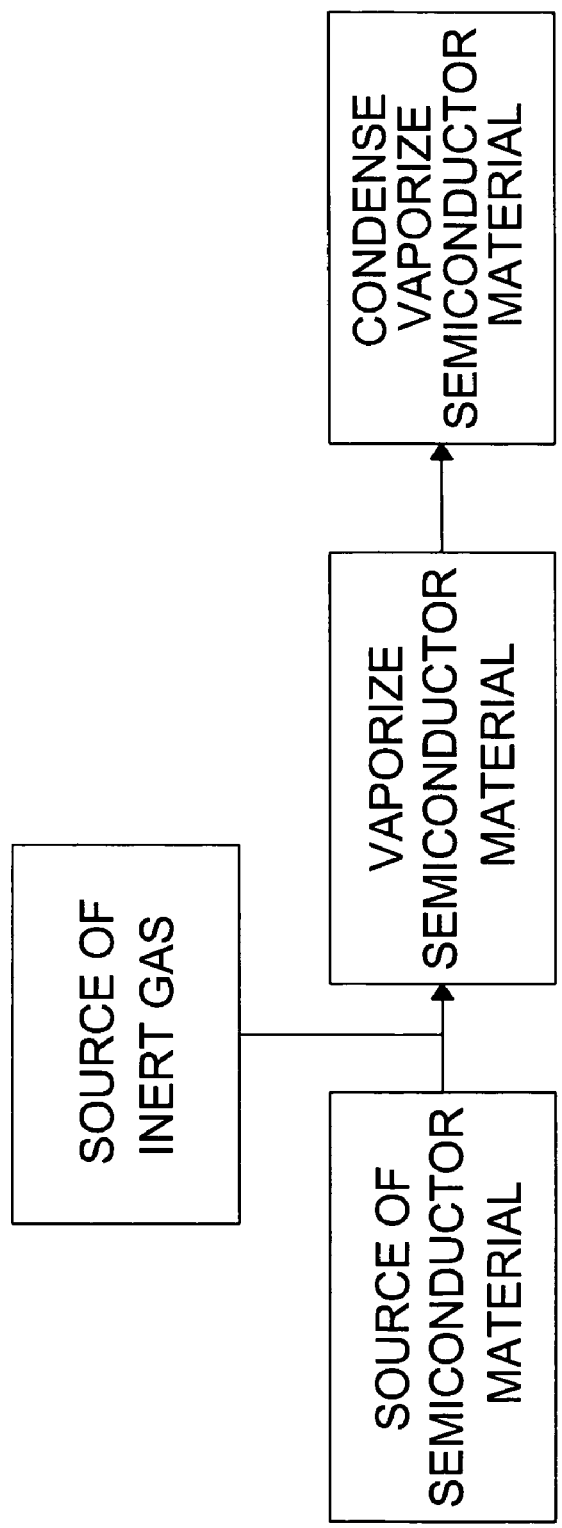
FIG. 1 is a schematic diagram of the process for depositing a semiconductor on a substrate.

Referring to FIG. 1, there is schematically illustrated the steps of the process for coating a surface of a substrate 10 with a film of cadmium telluride at atmospheric pressure.

Figure 2A:
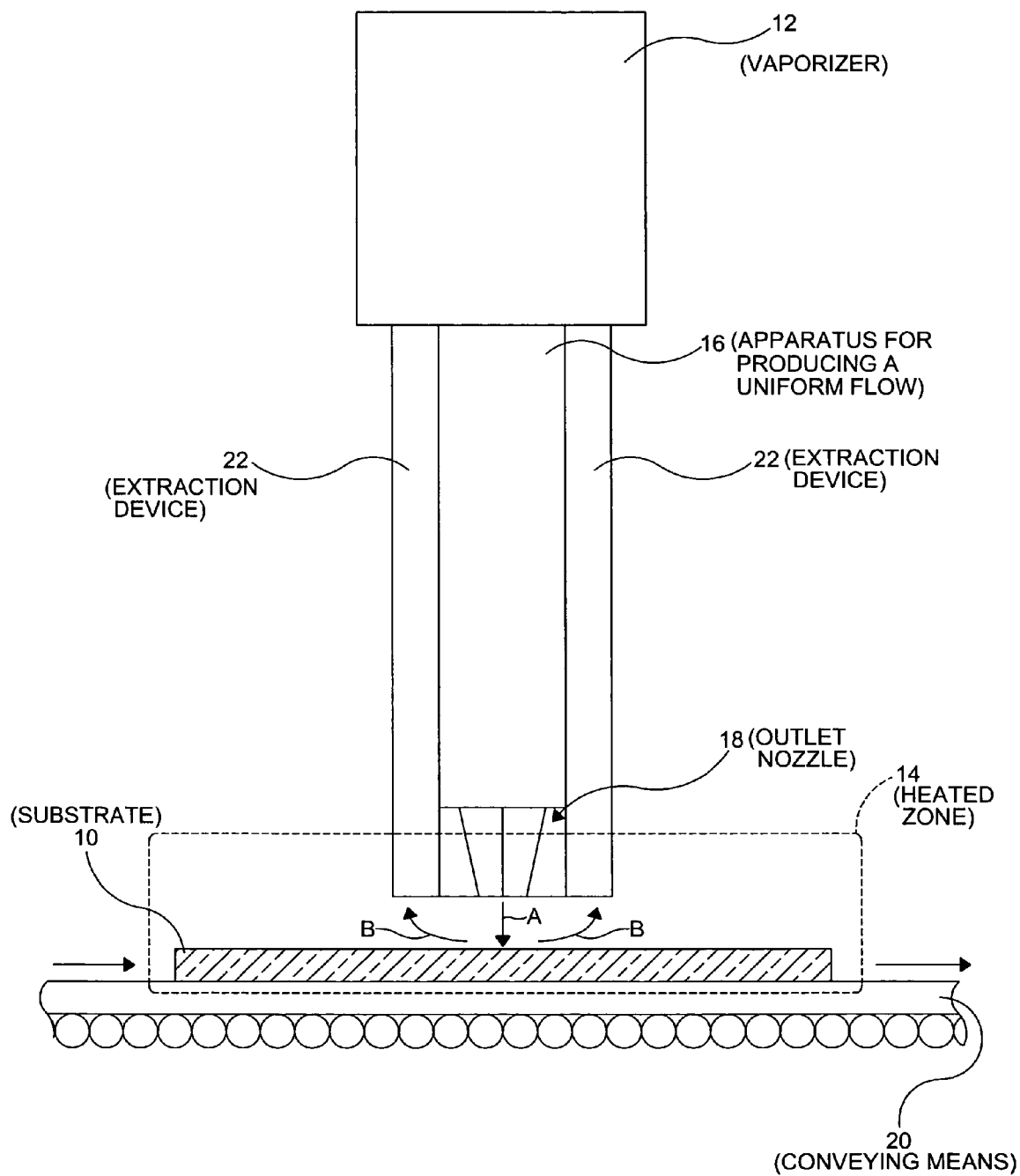
FIG. 2a is a schematic illustration of a system for depositing a semiconductor layer on a substrate using the process illustrated in FIG. 1 wherein the substrate is horizontal and perpendicular to an outlet nozzle.
Figure 2B:
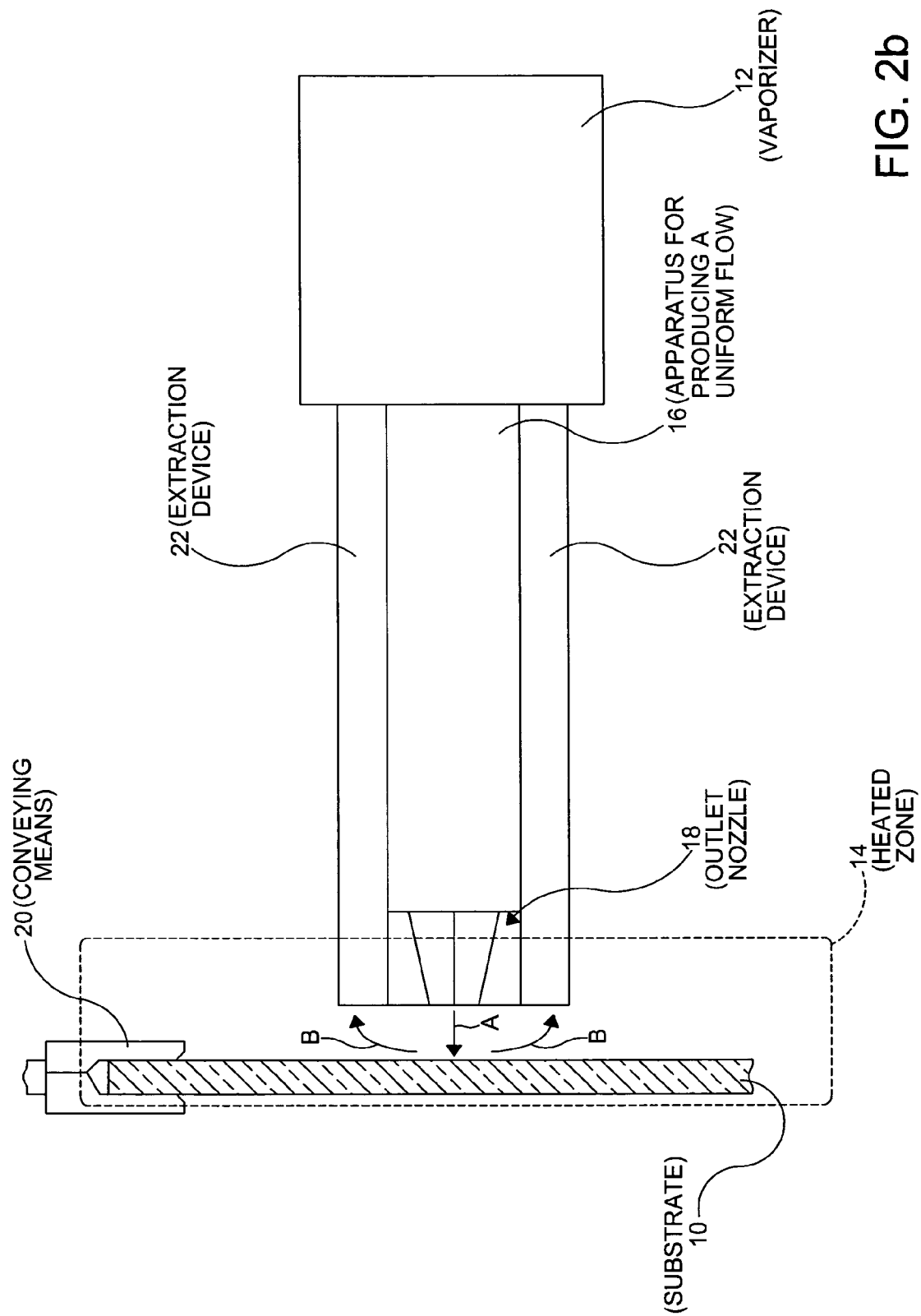
FIG. 2b is a schematic illustration of another system for depositing a semiconductor layer on a substrate using the process illustrated in FIG. 1 wherein the substrate is vertical and perpendicular to an outlet nozzle.

Individually metered masses of semiconductor material, preferably cadmium sulfide (CdS) or cadmium telluride (CdTe) in powdered form, are introduced into a zone which is continuously purged by a stream of inert gas, preferably nitrogen, flowing between an inlet and an outlet at approximately atmospheric pressure. The powder is carried from the inlet, by the inert gas flowing at a controlled rate, into a vaporizer 12 consisting of a heated packed bed in which the powder is vaporized as it passes through the interstitial voids of the packed bed's media. As shown in FIGS. 2a and 2b. The outlet of the heated packed bed is caused to communicate with the interior of a heated zone 14 to distribute the vaporized material to the substrate 10. Alternative powder vaporization methods through which the metered powder mass and carrier inert gas are heated may be employed for generating the vaporized material fluid stream. The alternative methods may include, but are not necessarily limited to, heated fluidized beds in which the carrier inert gas is heated and the powder is vaporized, thermal "flash" vaporizers that heat the carrier inert gas and vaporize the powder, and atmospheric pressure thermal spray units that heat the carrier inert gas and vaporize the powder.

The fluid, preferably including cadmium sulfide or cadmium telluride powder and the carrier inert gas, is a high temperature flowing mixture comprising the carrier inert gas and vaporized material at a temperature above its condensation temperature. The temperature of the fluid mixture is typically in a range of from about 800.degree. C. to about 1,100.degree. C. The heated fluid mixture is then directed into an apparatus 16 for producing a laminar flow of constant velocity toward the surface of the substrate 10 at substantially atmospheric pressure. The substrate 10 is typically a soda-lime glass, preferably having a low-E coating that is transparent and electrically conductive. An example of such glass is produced by Pilkington Glass Co. and is designated as TEC-15. The surface of the substrate 10 is maintained at a temperature of from about 585.degree. C. to about 650.degree. C.

The apparatus 16 for producing the desired laminar flow of fluid mixture comprises of a series of individual passageways adapted to cause a series of velocity changes in the transient fluid as the fluid flows through the passageways. The apparatus 16 is maintained above the vaporization temperature of the cadmium sulfide or cadmium telluride, to prevent condensation of the material within the passageways. Such fluid flow evenly distributes the fluid mixture to an elongate outlet nozzle 18, and enables uniform laminar flow at constant mass flow distribution to flow tangentially of and supplied to the surface of the substrate 10, as indicated by arrow A. The above action causes the molecules of the fluid mixture to be evenly distributed throughout the length of the elongate outlet nozzle 18, and causes the molecules to travel from the outlet nozzle in a generally parallel path and at a constant velocity, producing a laminar flow of constant velocity and mass distribution directed toward the substrate 10.

The velocity of the fluid mixture exiting the outlet nozzle 18 may be regulated by controlling the mass flow rate at which the fluid mixture is introduced at the inlet.

In order to control the thin-film deposition rate of the vaporized material within the fluid emitted from the apparatus being applied to the substrate 10, the mass flow rate of the fluid mixture and the velocity of the substrate 10 are controlled while controlling the temperature of the substrate 10 below the vaporized material's condensation point. As the heated fluid mixture impinges onto the cooler substrate 10, it cools to a temperature below the condensation temperature of the vaporized material. The material condenses from the fluid mixture, in a polycrystalline form, onto the substrate 10 moving on a conveying means 20 as a continuous thin-film layer. A fluid extraction device 22 is disposed upstream and downstream of the outlet nozzle 18, to enable the controlled withdrawal of the non-film generating constituents of the fluid mixture directed to the surfaces of the substrate 10, as indicated by arrows B.

While there may be a number of different systems for evenly distributing the vaporized cadmium sulfide or cadmium telluride on the surface of the transient glass substrate, it is contemplated that the apparatus illustrated and described in U.S. Pat. No. 4,509,526 to Hofer et al. may provide satisfactory results.

The deposition of any number of consecutive layers of cadmium sulfide and/or cadmium telluride by the apparatus described above, to prepare a laminar structure, is contemplated by the present invention.

Subsequent to the deposition of a cadmium telluride polycrystalline thin-film, a re-crystallization step would be required to allow the production of photovoltaic devices from the laminar thin-film stack. It has been found that this step can be achieved in less than one minute by subjecting the hot cadmium telluride film to a hot gaseous atmosphere of dilute hydrogen chloride in nitrogen at substantially one atmosphere of pressure. The ability to control the re-crystallization of the cadmium telluride while maintaining the temperature of the substrate 10 eliminates cool-down and re-heating of the substrate/film-stack assembly during the re-crystallization step. The use of a "dry" re-crystallization step eliminates the use of a toxic cadmium chloride solution and its application apparatus. Typically, a glass substrate exiting the in-line re-crystallization process would have a temperature from about 620.degree. C. to about 630.degree. C. This temperature range allows the glass to be thermally tempered by cool quenching gas flows as the substrate/film-stack exits the processing line.

The above-described process relates to a method for producing a thin-film cadmium sulfide/cadmium telluride photovoltaic material on the surface of a soda-lime glass substrate, to provide large area photovoltaic panels. However, it must be understood that the concept of atmospheric vapor deposition can be extended to include other thin-film materials that are normally deposited in a vacuum.

Thin-film photovoltaic materials that could be considered are CIGS (copper-indium-gallium-diselenide), CdS/CIS-alloy (cadmium sulfide/copper-indium-selenium alloy), amorphous silicon or thin-film polycrystalline silicon, and Zn (O, S, OH).sub.x/CIGS (zinc oxide sulfide hydroxide/copper-indium-gallium-diselenide).

Other thin-film materials that can be considered for application to glass substrates are optical coatings such as multi-layer stacks used for very low emissivity films and anti-reflection films. Other value added features such as improved durability films, self-cleaning films, photo-optic, and electro-optic films could be developed using the inventive atmospheric pressure deposition concept.

The process of atmospheric pressure deposition of thin-film materials could be applied to a variety of substrate materials for enhancement of their surface properties. Substrates that could be considered include polymeric materials, ceramics, metals, wood, and others.

What is claimed is:

1. A process for coating a substrate heated to a temperature below the condensation temperature of a semiconductor material at atmospheric pressure, comprising the steps of:
    mixing a controlled mass of semiconductor material and a heated inert gas stream;
    vaporizing the semiconductor material in the heated inert gas stream to create a fluid mixture having a temperature above the condensation temperature of the semiconductor material;
    directing the fluid mixture at the substrate, wherein the substrate is at substantially atmospheric pressure; and
    depositing a layer of the semiconductor material onto a surface of the substrate.

2. The process according to claim 1, wherein the semiconductor material is one of cadmium sulfide and cadmium telluride.

3. The process according to claim 1, wherein the inert gas is nitrogen.

4. The process according to claim 1, wherein the temperature of the fluid mixture ranges from about 800 degrees C. to about 1,100 degrees C.

5. The process according to claim 1, wherein the substrate comprises glass.

6. The process according to claim 5, wherein the glass includes a transparent, electrically conductive coating.

7. The process according to claim 1, wherein the substrate has a temperature ranging from about 585 degrees C. to about 650 degrees C.

8. The process according to claim 1, wherein the steps of vaporizing, directing, and depositing are repeated at least once, to deposit at least one additional layer of semiconductor material on the substrate.

9. A process for coating a substrate heated to a temperature below the condensation temperature of a semiconductor material at atmospheric pressure, comprising the steps of:
    mixing a controlled mass of semiconductor material and a heated inert gas stream;
    vaporizing the semiconductor material in the heated inert gas stream to create a fluid mixture having a temperature ranging from about 800 degrees C. to about 1,100 degrees C.;
    directing the fluid mixture at the substrate having a transparent, electrically conductive coating and having a temperature range from about 585 degrees C. to about 650 degrees C. and at substantially atmospheric pressure; and
    depositing a layer of the semiconductor material onto a surface of the substrate.

10. The process according to claim 9, wherein the steps of vaporizing, directing, and depositing are repeated at least once, to deposit at least one additional layer of semiconductor material on the substrate.

11. A process for coating a substrate heated to a temperature below the condensation temperature of a semiconductor material at atmospheric pressure, comprising the steps of:
    mixing a controlled mass of semiconductor material and a heated inert gas stream;
    vaporizing the semiconductor material in the heated inert gas stream to create a fluid mixture having a temperature ranging from about 800 degrees C. to about 1,100 degrees C.;
    directing the fluid mixture at the substrate having a transparent, electrically conductive coating and having a temperature range from about 585 degrees C. to about 650 degrees C. and at substantially atmospheric pressure;
    depositing a layer of the semiconductor material onto a surface of the substrate; and
    repeating the steps of vaporizing, directing, and depositing at least once, to deposit at least one additional layer of semiconductor material onto the substrate.

12. The process according to claim 1, wherein the semiconductor material is one of CIGS (copper-indium-gallium-diselenide), CdS/CIS-alloy (cadmium sulfide/copper-indium-selenium alloy), amorphous silicon or thin-film polycrystalline silicon, and Zn $(O, S, OH)_x$/CIGS (zinc oxide sulfide hydroxide/copper-indium-gallium-diselenide).

13. The process according to claim 1, further including a step of providing movement of the substrate with respect to a source of the fluid mixture.

14. The process according to claim 1, further including a step of selectively controlling the mass flow rate of the fluid mixture to control a depositing rate of the semiconductor material onto the substrate.

* * * * *